United States Patent
Dong et al.

(10) Patent No.: US 9,368,187 B2
(45) Date of Patent: Jun. 14, 2016

(54) INSERTION-OVERRIDE COUNTER TO SUPPORT MULTIPLE MEMORY REFRESH RATES

(71) Applicant: QUALCOMM Incorporated, San Diego, CA (US)

(72) Inventors: Xiangyu Dong, San Diego, CA (US); Jung Pill Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 214 days.

(21) Appl. No.: 14/149,543

(22) Filed: Jan. 7, 2014

(65) Prior Publication Data
US 2015/0016204 A1   Jan. 15, 2015

Related U.S. Application Data (60) Provisional application No. 61/845,071, filed on Jul. 11, 2013.

(51) Int. Cl.
  *G11C 7/00* (2006.01)
  *G11C 11/406* (2006.01)
(52) U.S. Cl.
  CPC .... *G11C 11/40618* (2013.01); *G11C 11/40611* (2013.01); *G11C 11/40622* (2013.01); *G11C 2211/4061* (2013.01); *G11C 2211/4065* (2013.01)
(58) Field of Classification Search
  USPC .......................................... 365/222, 235, 236
  See application file for complete search history.

(56) References Cited

U.S. PATENT DOCUMENTS

| 7,095,669 | B2 | 8/2006 | Oh |
| 7,116,602 | B2 | 10/2006 | Klein |
| 7,193,918 | B2 | 3/2007 | Harrand et al. |
| 7,301,844 | B2 | 11/2007 | Dono et al. |
| 7,551,502 | B2 | 6/2009 | Dono et al. |
| 7,734,866 | B2 | 6/2010 | Tsern |
| 7,742,355 | B2 | 6/2010 | Kohler et al. |
| 2007/0033339 | A1 | 2/2007 | Best et al. |
| 2012/0287727 | A1 | 11/2012 | Wang |
| 2013/0159617 | A1* | 6/2013 | Yu ............................ G08F 12/00 711/108 |
| 2013/0279284 | A1* | 10/2013 | Jeong ................... G11C 11/402 365/222 |
| 2014/0189215 | A1* | 7/2014 | Kang ............... G11C 11/40603 711/103 |
| 2014/0241093 | A1* | 8/2014 | Lee ................... G11C 11/40611 365/222 |
| 2014/0269134 | A1* | 9/2014 | Kim ...................... G11C 11/408 365/222 |

OTHER PUBLICATIONS

International Search Report and Written Opinion—PCT/US2014/038846—ISA/EPO—Sep. 15, 2014.

* cited by examiner

*Primary Examiner* — Toan Le
(74) *Attorney, Agent, or Firm* — Linda G. Gunderson (57) ABSTRACT

A memory refresh method includes determining positions at which to insert refresh operations of weak rows of a memory block among regularly scheduled refresh operations of normal rows of the memory block. The refresh operations occur at a substantially constant refresh rate. The positions at which to insert are based on an actual weak page address. The method also includes performing inserted refresh operations at the determined positions to coordinate distribution of the inserted refresh operations among the regularly scheduled refresh operations.

20 Claims, 13 Drawing Sheets

INSERTION-OVERRIDE COUNTER TO SUPPORT MULTIPLE MEMORY REFRESH RATES

CROSS-REFERENCE TO RELATED APPLICATION

The present application claims the benefit of U.S. Provisional Patent Application No. 61/845,071 filed on Jul. 11, 2013, in the names of Xiangyu Dong et al., the disclosure of which is expressly incorporated by reference herein in its entirety.

TECHNICAL FIELD

This disclosure relates to electronic memory operation and more specifically to a refresh scheme for memory rows with a weak retention time.

BACKGROUND

Semiconductor memory devices include, for example, static random access memory (SRAM) and dynamic random access memory (DRAM). A DRAM memory cell generally includes one transistor and one capacitor, in which the capacitor can be either charged or discharged to store information as a corresponding bit value (e.g., 0 or 1). Because capacitors leak charge, the stored information eventually fades unless the capacitor charge is refreshed periodically. Due to the refresh requirement, DRAM is referred to as dynamic memory as opposed to SRAM and other static memory.

DRAM scaling continues to increase the total number of bits for each DRAM chip, directly impacting the specification of DRAM refresh operations, the process by which a cell's value is kept readable. The specification of DRAM refresh operations includes the interval at which refresh commands are sent to each DRAM (tREF) and the amount of time that the refresh command occupies the DRAM interface and the DRAM conducts the refresh (tRFC). Unfortunately, DRAM scaling increases the number of weak retention rows (e.g., rows that have at least one cell that has a reduced retention time). Such rows involve additional refresh cycles to maintain the stored information. A significant performance and power consumption impact is caused by the increased refresh cycles in a system on chip or other like computer architecture. Otherwise, potential DRAM chip yield loss results without increased refresh cycles.

SUMMARY

In one aspect of the present disclosure, a memory refresh method includes determining positions at which to insert refresh operations of weak rows of a memory block among regularly scheduled refresh operations of normal rows of the memory block. The refresh operations also occur at a substantially constant refresh rate, and the positions at which to insert are based on an actual weak page address. The method also includes performing inserted refresh operations at the determined positions to coordinate distribution of the inserted refresh operations among the regularly scheduled refresh operations.

Another aspect discloses a memory chip including a dynamic memory, and a refresh control block coupled to the dynamic memory. The refresh control block includes a refresh counter and control logic. The control logic is operable to determine positions at which to insert refresh operations of weak rows of the dynamic memory among regularly scheduled refresh operations of normal rows of the dynamic memory. The positions at which to insert are also based on an actual weak page address. The control logic is also operable to perform the inserted refresh operations at the determined positions to coordinate distribution of the inserted refresh operations among the regularly scheduled refresh operations.

In another aspect, a memory chip is disclosed. The memory chip includes a dynamic memory, and a refresh control block coupled to the dynamic memory. The refresh control block includes a refresh counter. The refresh control block includes means for determining positions at which to insert refresh operations of weak rows of the dynamic memory among regularly scheduled refresh operations of normal rows of the dynamic memory. The refresh operations occur at a substantially constant refresh rate, and the positions at which to insert are based on an actual weak page address. The refresh control block also includes means for performing inserted refresh operations at the determined positions to coordinate distribution of the inserted refresh operations among the regularly scheduled refresh operations.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. Nevertheless, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Dynamic random access memory (DRAM) scaling continues to increase the total number of bits for each DRAM chip. This increased capacity directly impacts the specification of DRAM refresh operations, the process by which a bit cell's value is kept readable. The specification of DRAM refresh operations includes the interval at which refresh commands are sent to each DRAM (tREF), and the amount of time that the refresh command occupies the DRAM interface and the DRAM conducts the refresh (tRFC). Unfortunately, DRAM scaling also increases the number of weak retention rows (e.g., rows that have at least one cell with a reduced retention time). Such rows have increased refresh cycles to maintain the stored information. Performance and power consumption are significantly impacted by the increased refresh cycles on a DRAM in a system on chip (SoC) or other like computer architecture. Potential DRAM chip yield loss from the increased number of weak retention rows results without the increased refresh cycles.

One aspect of the present disclosure inserts a refresh cycle for rows with a weak retention state, without having to increase the refresh period (e.g., the refresh interval tREF). In one configuration, positions at which to insert additional refresh operations among refresh operations of multiple rows of a memory block are determined. In this configuration, the additional refresh operations are performed on rows of the memory block that have a weak retention state. In operation, the additional refresh operations are performed at the determined positions to evenly distribute the additional refresh operations among the multiple refresh operations.

Figure 1:
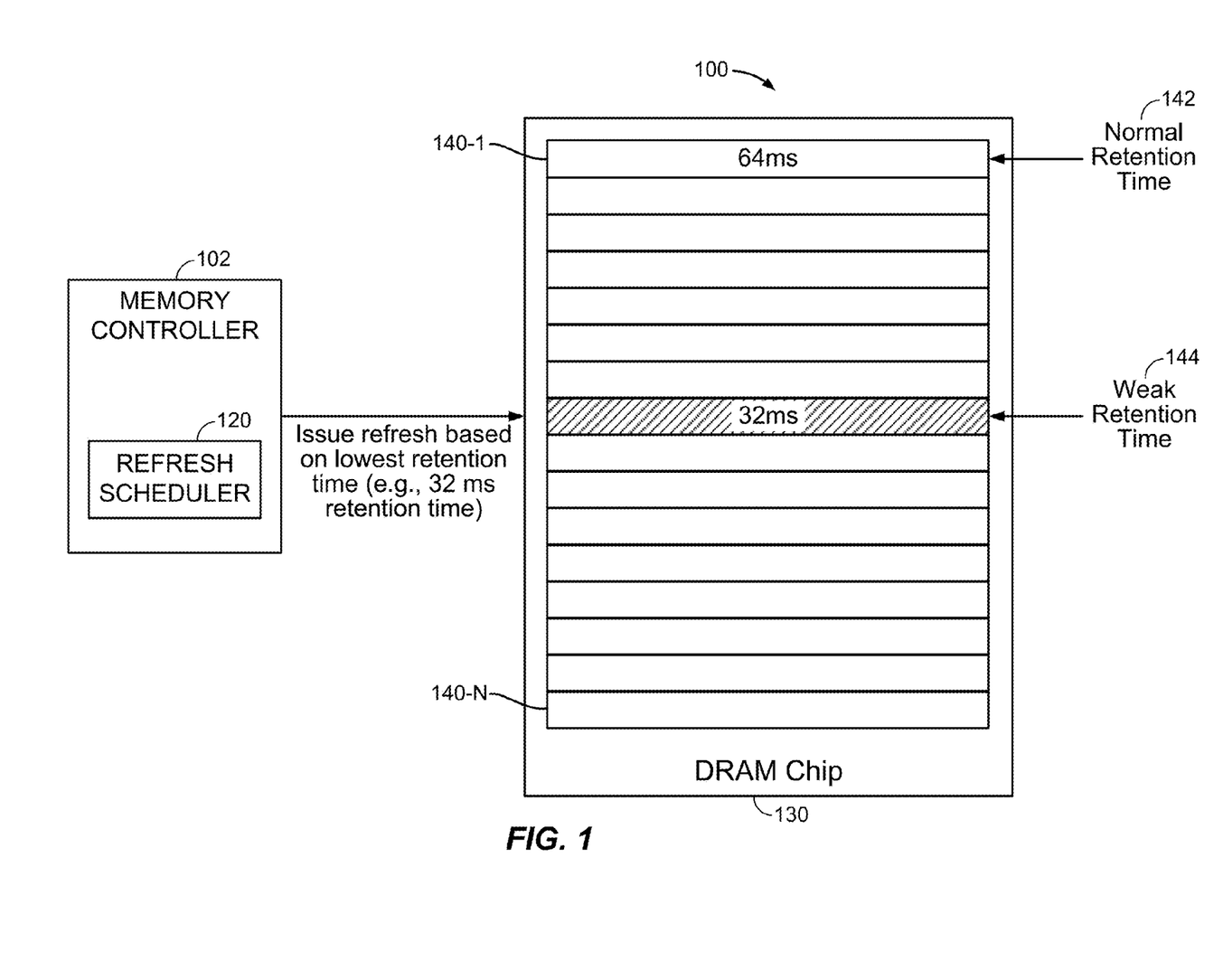
FIG. 1 is a block diagram illustrating a memory controller including a refresh scheduler according to an aspect of the present disclosure.

FIG. 1 is a block diagram 100 illustrating a memory controller 102 including a refresh scheduler 120 according to an aspect of the present disclosure. In this configuration, the memory controller is coupled to a DRAM chip 130 that includes rows 140 (140-1, . . . , 140-N). Because the capacitors (not shown) used to store information within the DRAM chip 130 leak charge, the stored data eventually fades unless the capacitor charge is refreshed periodically. In this configuration, a row 142 has a normal retention time (e.g., sixty-four (64) milliseconds (ms)) and a row 144 has a weak retention time (e.g., thirty-two (32) milliseconds (ms)). In this example, only the row 144 has a weak retention time. The other ones of the rows 140 of the DRAM chip 130 have the normal retention time. Conventionally, however, refresh operations are issued to the DRAM chip 130 based on the lowest retention time (e.g., 32 ms). In this configuration, the refresh scheduler inserts a refresh cycle for rows (e.g., row 144) with a weak retention state, without having to increase the refresh period for the rows 140 with the normal retention state.

Figure 2:
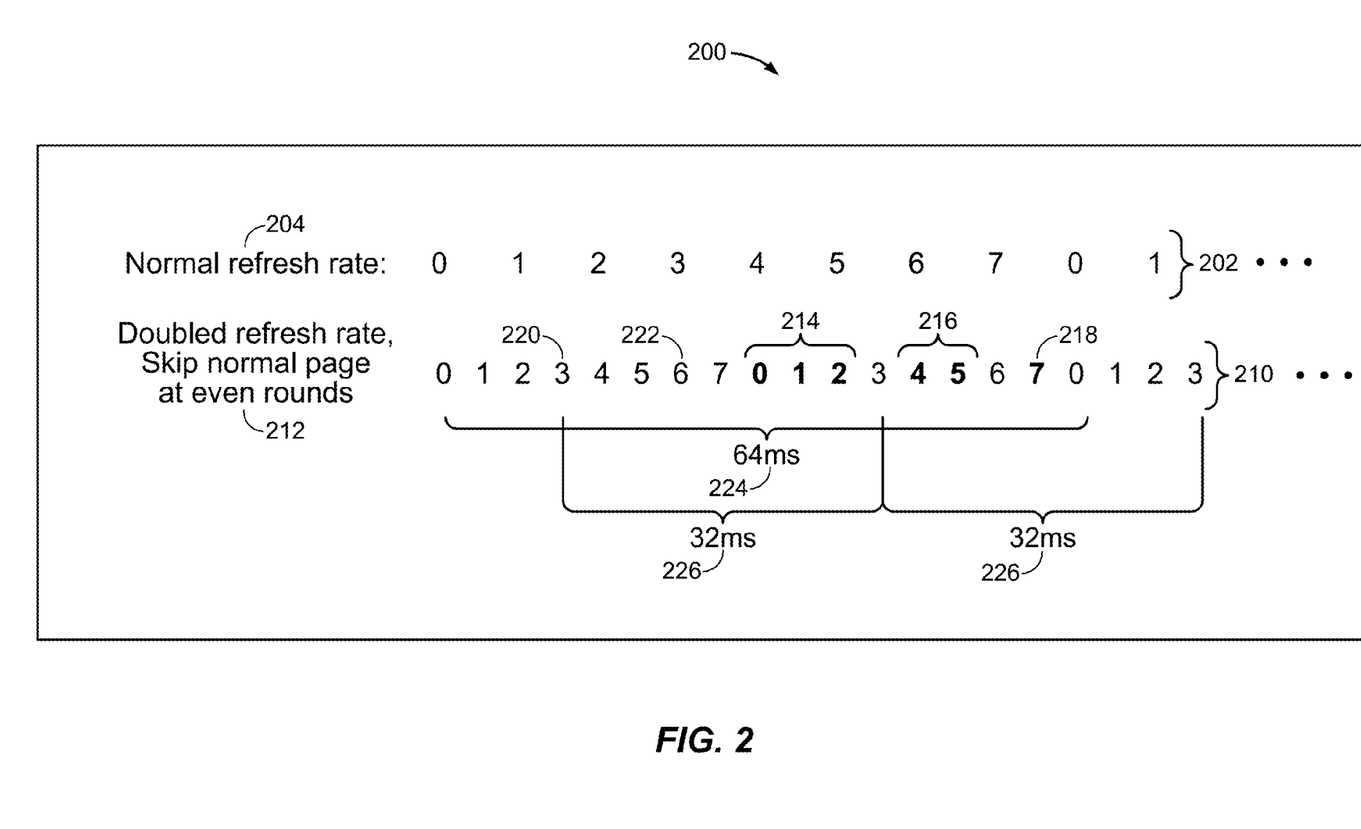
FIG. 2 illustrates refresh timing diagrams showing techniques for increasing a refresh frequency of memory rows with a weak retention state, while maintaining a refresh frequency for other memory rows, according to an aspect of the present disclosure.

FIG. 2 illustrates refresh timing diagrams 200 that show techniques for increasing a refresh frequency of memory rows (e.g., rows, pages, etc.) with a weak retention state, while maintaining a refresh frequency for other memory rows, according to aspects of the present disclosure. In this example, a DRAM chip vendor provides a memory retention time profile to indicate the memory rows (e.g., rows, pages, etc.) with a weak retention state as well as the memory rows with a normal retention state. Based on the profile, memory rows with a normal retention state are refreshed at the normal refresh rate 204. In addition, memory rows with a weak retention state are refreshed at a double refresh rate 212. FIG. 2 illustrates one example of how to issue refresh commands at multiple rates.

Representatively, refresh operations 202 are issued at a normal refresh rate 204 and refresh operations 210 are issued at a double refresh rate 212. For example, there are eight rows (e.g., pages, etc.) of memory. In addition, a first refresh address 220 and a second refresh address 222 have a weak retention state. In this example, refresh operations 210 are issued at the double refresh rate 212; and then some of the refresh operations (e.g., 214, 216 and 218) are skipped. Representatively, refresh operations 210 are performed on refresh addresses zero (0), one (1), two (2), three (3), four (4), five (5), six (6), and seven (7) during odd rounds. Refresh operations 214, 216 and 218 are skipped during even rounds. Thus, the first refresh address 220 and the second refresh address 222 with the weak retention state are refreshed at a cycle 226 of 32 ms. Conversely, a cycle 224 between refresh addresses with the normal retention state is 64 ms.

As shown in FIG. 2, the refresh cycle is doubled for the first refresh address 220 and the second refresh address 222 having the weak retention state, while skipping the refresh cycles for the refresh addresses with the normal retention state. Unfortunately, this configuration causes a memory controller to send out sixteen (16) commands (N*2), with six (6) commands (N-W) being useless, where N is the number of memory rows and W is the number of memory rows with a weak retention state. In addition, the refresh commands are not evenly distributed.

Figure 3:
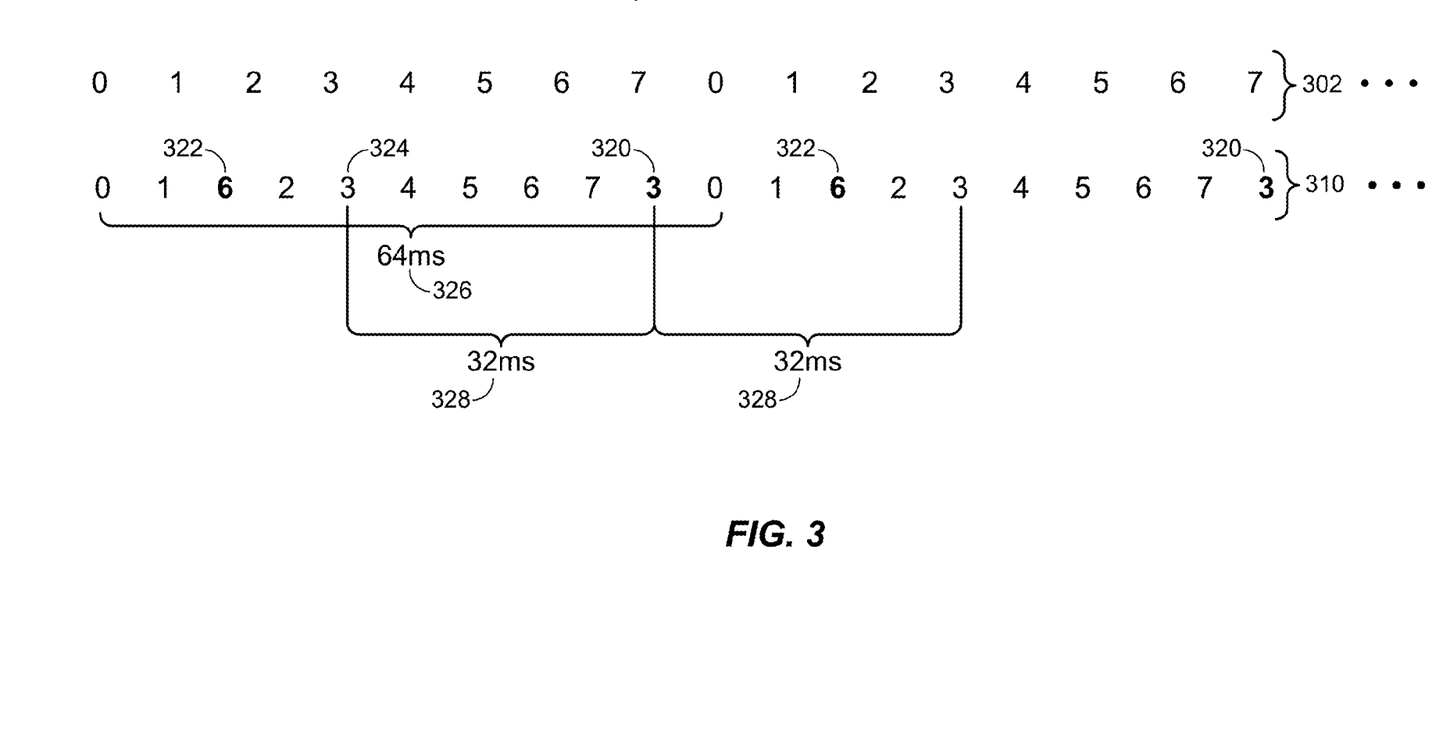
FIG. 3 shows timing diagrams illustrating a refresh operation insertion scheme to uniformly distribute inserted refresh operations for rows with a weak retention state among refresh operations for rows with a normal retention state according to an aspect of the present disclosure.

FIG. 3 shows timing diagrams 300 illustrating a refresh operation insertion scheme to uniformly distribute inserted refresh operations for rows with a weak retention state among refresh operations for rows with a normal retention state according to an aspect of the present disclosure. Representatively, refresh operations 302 are issued at a normal refresh rate (e.g., tREF). In this example, there are eight rows (e.g., pages, etc.) of memory. In addition, a first refresh address three (3) and a second refresh address six (6) have a weak retention state. In operation, the refresh operations 310 include an inserted refresh operation 320 and an inserted refresh operation 322 for the first refresh address 3 and the second refresh address 6 with the weak retention state. In this example, a refresh command issue interval is computed as follows:

$$tREF/(\# rows + \# weak\ rows) \quad (1)$$

In this example the refresh command issue interval is tREF/10 for insertion and tREF/16 for the skipping technique shown in FIG. 2. The inserted refresh operation 320 and the inserted refresh operation 322 are well distributed among the refresh operations 310. In this example, a cycle 328 between the inserted refresh operation 320 and the normal refresh time 324 for the first refresh address 3 having the weak retention state is 32 ms. Conversely, a cycle 326 between refresh operations for refresh addresses with the normal retention state is 64 ms.

Figure 4A:
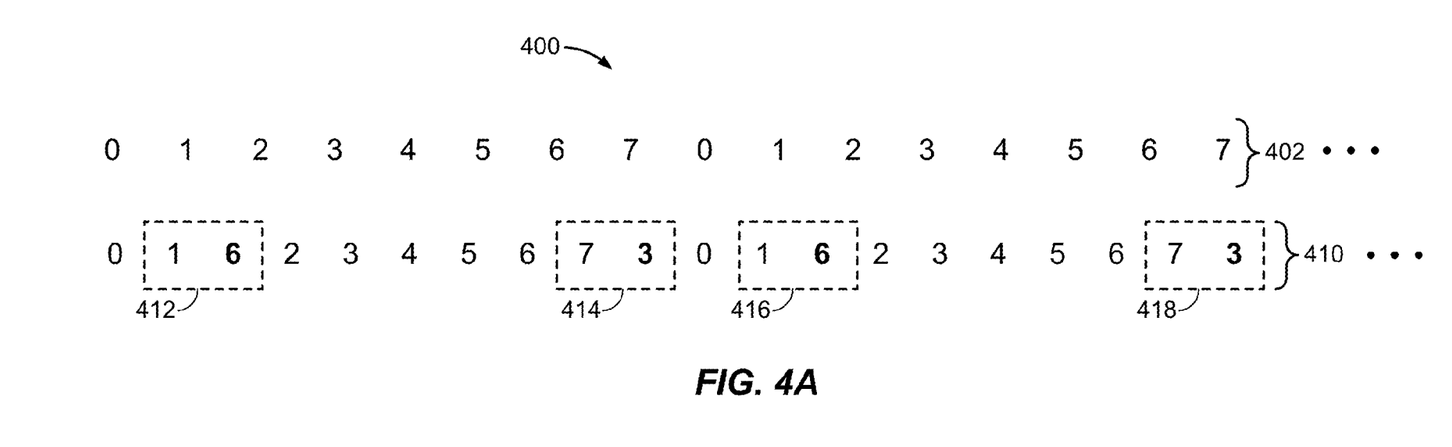
FIGS. 4A to 4D show timing diagrams and insertion tables illustrating refresh operation insertion schemes according to aspects of the present disclosure.
Figure 4B:
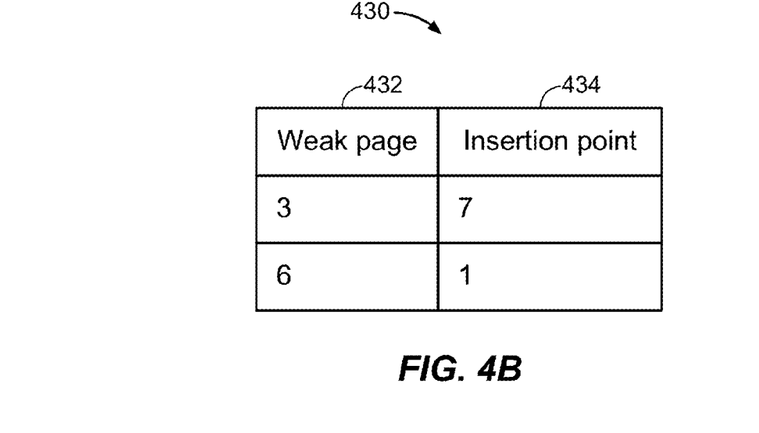

FIGS. 4A and 4B show timing diagrams 400 and an insertion table 430 illustrating a refresh operation insertion scheme according to an aspect of the present disclosure. Representatively, multiple refresh operations 402 are issued at a normal refresh rate (e.g., tREF). In this example, there are eight pages of memory. In addition, a first refresh address three (3) and a second refresh address six (6) have a weak retention state. In operation, refresh operations 410 include an inserted refresh period 412, an inserted refresh period 414, an inserted refresh period 416, and an inserted refresh period 418 for the first refresh address 3 and the second refresh address 6 with the weak retention state. The inserted refresh periods 412 and 416 include an extra refresh operation for the second refresh address 6 after the normal refresh operation for the refresh address 1. The inserted refresh periods 414 and 418 include an extra refresh operation for the first refresh address 3 after the normal refresh operation for the refresh address seven.

As shown in FIG. 4B, the insertion table 430 includes a weak page column 432 and an insertion point column 434. Although described in terms of weak pages, it should be recognized that the insertion table 430 can provide insertion point information for weak memory rows, memory pages and the like. In this example, weak page 3 receives inserted refresh operations during the inserted refresh period 414 and the inserted refresh period 418 when a refresh counter reaches the insertion point value (e.g., 7). Similarly, weak page 6 receives inserted refresh operations during inserted refresh period 412 and inserted refresh period 416 when the refresh counter reaches the insertion point value (e.g., 1).

Figure 4C:
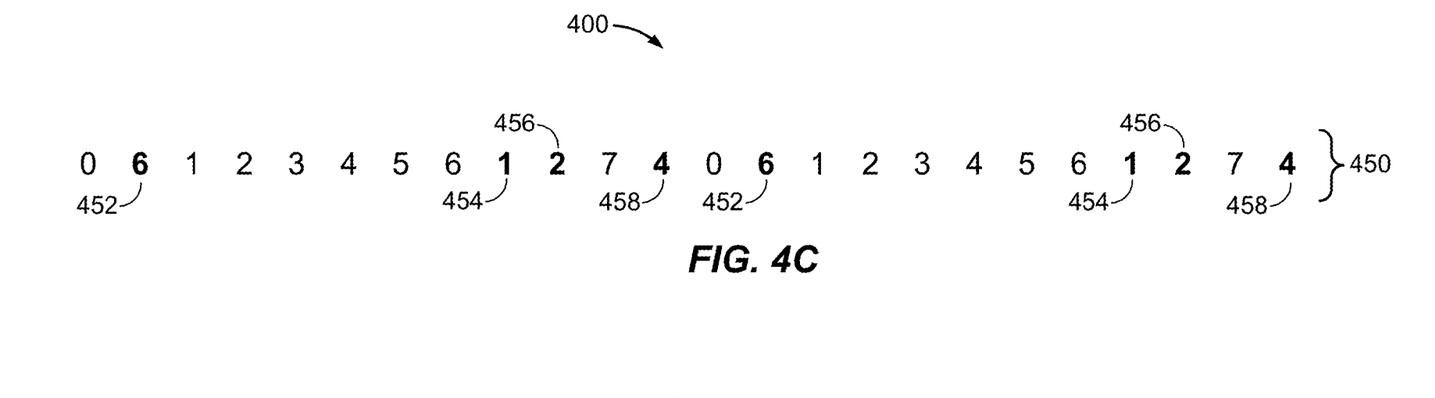
Figure 4D:
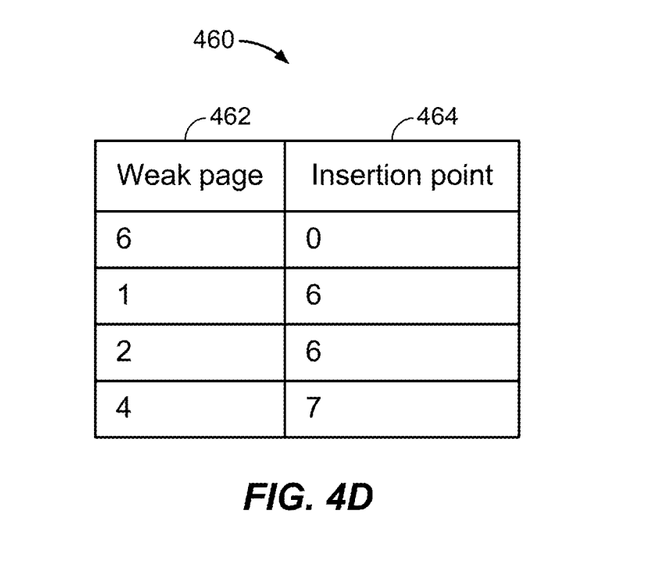

FIGS. 4C and 4D show a timing diagram 440 and an insertion table 460 illustrating a refresh operation insertion scheme according to another aspect of the present disclosure. In this example, there are eight pages of memory. In addition, refresh address one (1), refresh address two (2), refresh address four (4) and refresh address six (6) have a weak retention state. In operation, refresh operations 450 include inserted refresh operation 452, inserted refresh operation 454, inserted refresh operation 456, and inserted refresh operation 458 for the weak pages 1, 2, 4 and 6. The insertion point information is read from the insertion table 460, including a weak page column 462 and an insertion point column 464, as shown in FIG. 4D. Thus, an inserted refresh operation 452 for weak page 6 occurs after a normal refresh operation for normal page zero (0). In addition, the inserted refresh operation 454 and the inserted refresh operation 456 for weak pages 1 and 2, respectively, occur after the normal refresh operation for weak page 6. An inserted refresh operation 458 for weak page 4 occurs after the normal refresh operation for normal page seven (7).

Figure 5A:
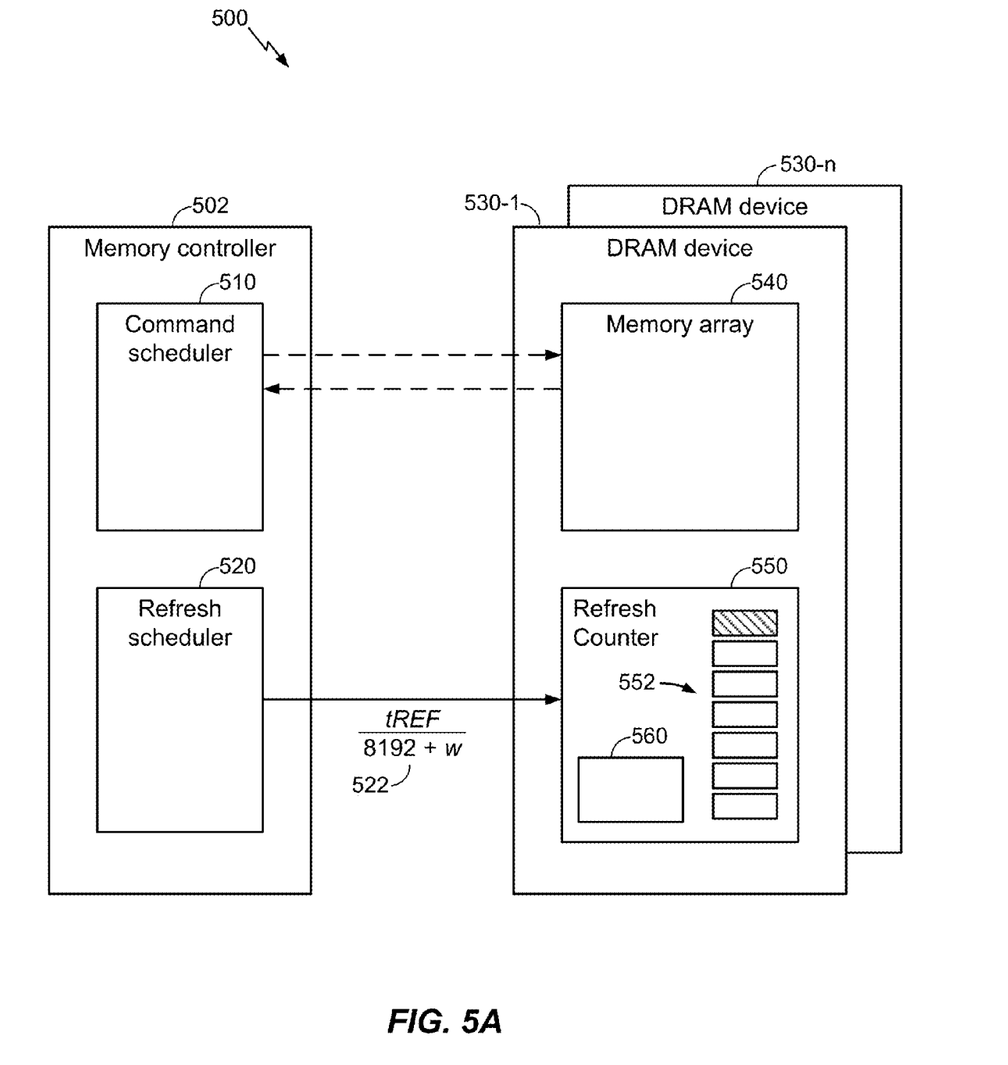
FIG. 5A is a block diagram illustrating a memory controller including a command scheduler and a refresh scheduler to periodically issue refresh commands. An enhanced refresh counter is implemented in DRAM to uniformly distribute inserted refresh operations according to an aspect of the present disclosure.

FIG. 5A is a block diagram 500 illustrating a memory controller 502 including a command scheduler 510 and a refresh scheduler 520 to uniformly distribute inserted refresh operations according to an aspect of the present disclosure. In this configuration, the memory controller 502 is coupled to DRAM devices 530 (530-1, . . . , 530-n), each including a memory array 540. The refresh scheduler 520 issues refresh operations at a refresh interval 522 (tREF/(8192+W)), where W is the number of weak pages of an 8K (8192) refresh cycle. Although this example is with respect to 8K, of course other memory sizes could also be used.

Figure 5B:
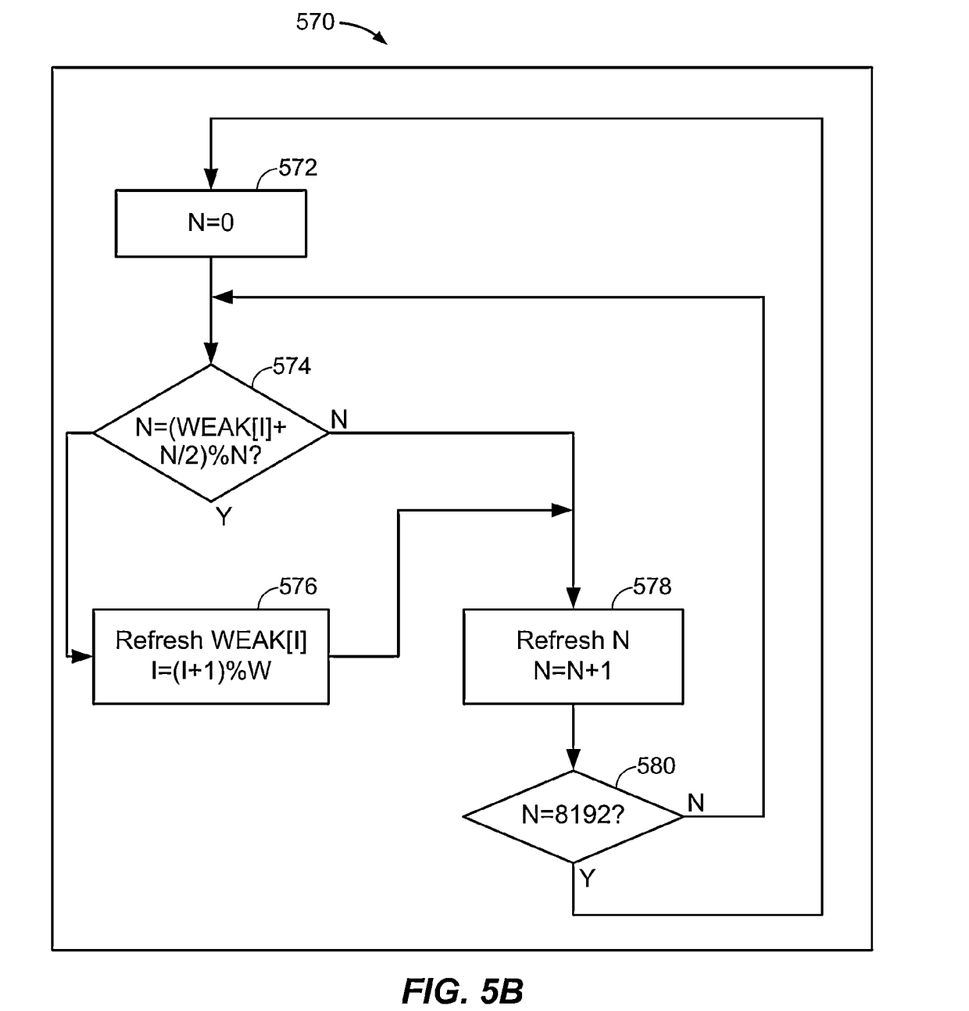
FIG. 5B is a flow chart illustrating a refresh scheme for memory rows with a weak retention state according to another aspect of the present disclosure.

In this aspect of the disclosure, the DRAM devices 530 include a refresh counter 550 having a weak page memory 552 and a refresh control logic 560. In this configuration, a DRAM vendor profiles the memory arrays 540 to provide, for example, an indication of the memory row, memory pages or the like (weak[0, 1, . . . , W−1]), which is stored in the weak page memory 552. In this configuration, the refresh counter 550 in combination with the refresh control logic 560 inserts refresh operations as follows, as further illustrated in FIG. 5B:

$$\text{Insert WEAK}[I]\ \text{at}\ (\text{WEAK}[I]+N/2)\%\ N \quad (2)$$

where "%" is a modulo operation, "N" is a refresh counter value, and "I" is the position.

FIG. 5B is a flow chart 570 illustrating a refresh scheme for memory pages with a weak retention state according to an aspect of the present disclosure. At block 572, a refresh counter value (N) is initialized. At block 574, it is determined whether the refresh counter value N equals the insertion point of (WEAK[I]+N/2) % N. When the refresh counter N equals the insertion point ((WEAK[I]+N/2) % N), at block 576, a refresh operation is inserted at position I. Also, the position I is reset to I=(I+1) % W, where W is the number of weak pages. Next, a refresh operation is performed for the refresh counter value N at block 578. At block 580, blocks 574 to 578 are repeated until the refresh counter value N equals 8192 (8K), in this example, for an 8K refresh cycle. Once the refresh counter N equals 8192, the process returns to block 772.

Figure 5C:
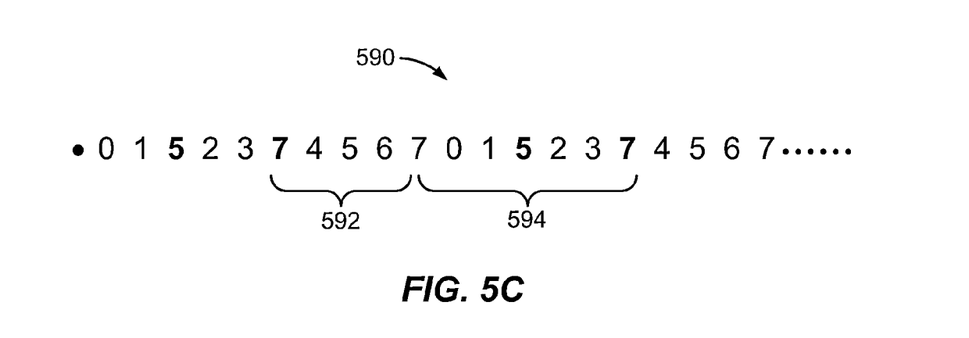
FIG. 5C shows a timing diagram illustrating a refresh operation insertion scheme of FIG. 5B according to an aspect of the present disclosure.

FIG. 5C shows a timing diagram 590 illustrating a refresh operation insertion scheme of FIG. 5B according to an aspect of the present disclosure. In this example, there are eight pages of memory. In addition, refresh address five (5) and refresh address seven (7) have a weak retention state. In operation, an inserted refresh operation for page 5 is provided at refresh address two (2) and an inserted refresh operation for refresh address 7 is provided at refresh address 5. Unfortunately, this insertion scheme may lead to a non-uniform distribution of the inserted refresh operations because the time interval 592 is different from the time interval 594.

Figure 6:
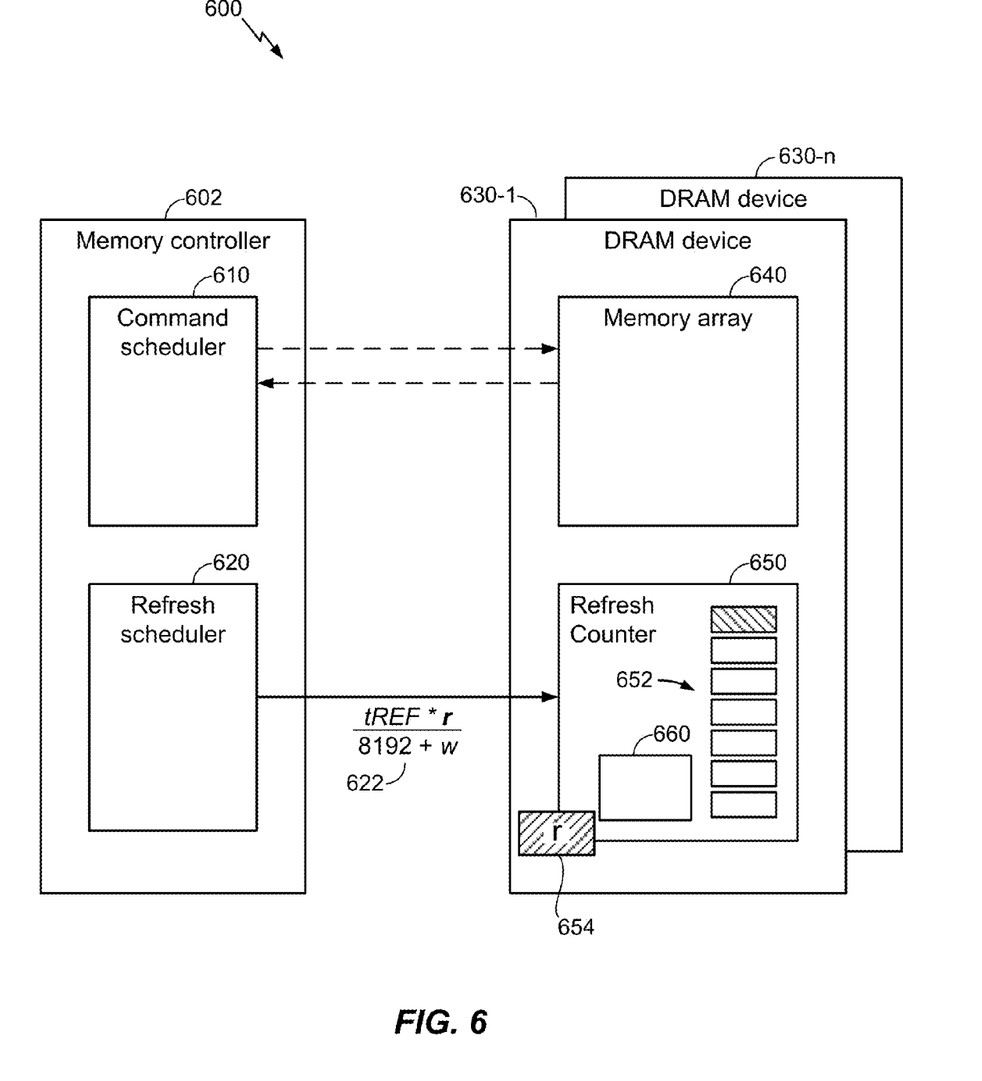
FIG. 6 is a block diagram illustrating a memory controller including a command scheduler and a refresh scheduler to periodically issue refresh commands, and an enhanced refresh counter to insert refresh operations based on an asymmetric ratio according to an aspect of the present disclosure.

FIG. 6 is a block diagram 600 illustrating a memory controller 602 including a command scheduler 610 and a refresh scheduler 620 to insert refresh operations based on an asymmetric ratio according to an aspect of the present disclosure. In this configuration, the memory controller 602 is coupled to DRAM devices 630 (630-1, . . . , 630-n), each including a memory array 640. Although similar to FIG. 5A, in this configuration, the refresh scheduler 620 issues refresh operations at an increased refresh interval 622 ((tREF*R/(8192+W)), where R is an asymmetric ratio provided by the DRAM vendor (usually less than 1% for an 8K refresh cycle). In this configuration, the DRAM devices 630 include a refresh counter 650 having a weak page memory 652, refresh control logic 660 and the asymmetric ratio 654.

Figure 7A:
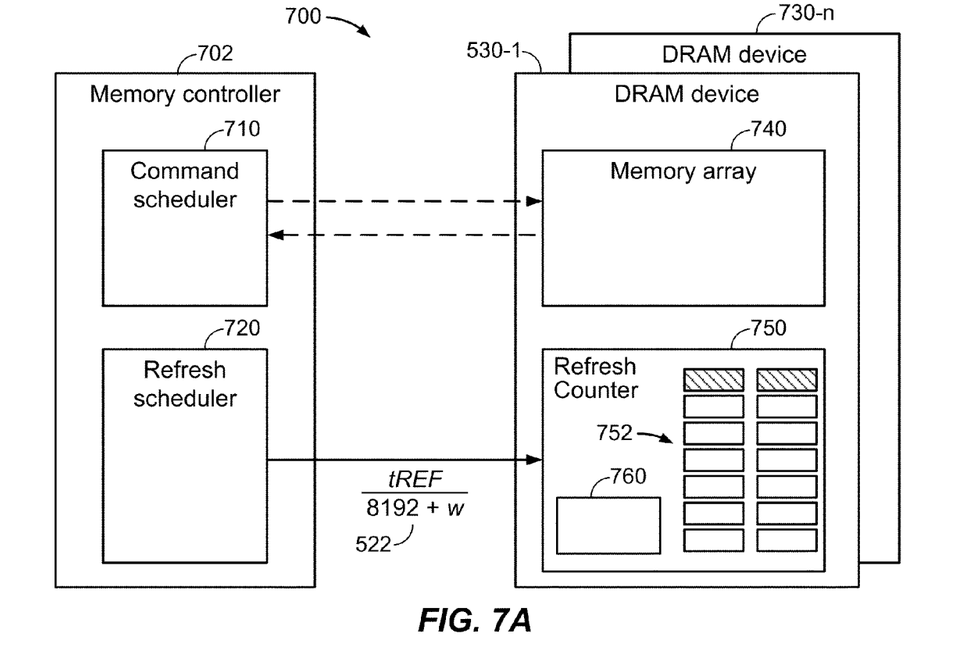
FIG. 7A is a block diagram illustrating a memory controller including a command scheduler and a refresh scheduler to periodically issue refresh commands, and an enhanced refresh counter to insert refresh operations based on pre-calculated insertion positions according to another aspect of the present disclosure.

FIG. 7A is a block diagram 700 illustrating a memory controller 702 including a command scheduler 710 and a refresh scheduler 720 to insert refresh operations according to another aspect of the present disclosure. In this configuration, the memory controller 702 is also coupled to DRAM devices 730 (730-1, . . . , 730-N), each including a memory array 740. Although similar to FIG. 6, in this configuration, the DRAM vendor pre-calculates the insertion positions (POS[0, 1, . . . , W−1]) as well as the weak pages (WEAK[0, 1, . . . , W−1]), which are stored in the weak page memory 752. In this configuration, the refresh counter 750 in combination with the refresh control logic 760 inserts refresh operations as further illustrated in FIG. 7B.

Figure 7B:
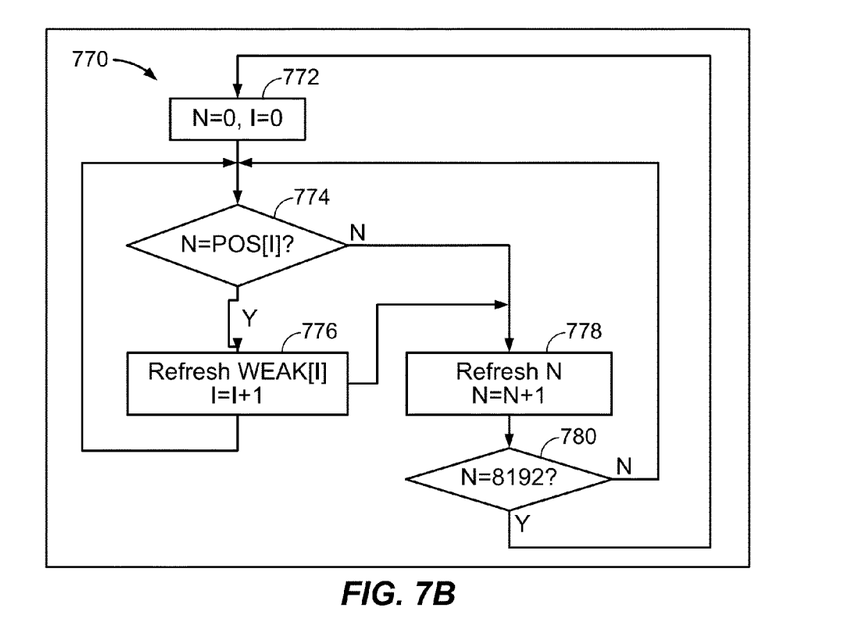
FIG. 7B is a flow chart illustrating a refresh scheme for memory rows with a weak retention state based on the pre-calculated insertion positions of FIG. 7A according to another aspect of the present disclosure.

FIG. 7B is a flow chart 770 illustrating a refresh scheme for memory pages with a weak retention state according to an aspect of the present disclosure. At block 772, a refresh counter value (N) and a position counter value (I) are initialized. At block 774, it is determined whether the refresh counter value N equals an insertion point (N=POS[I]). In this example, the insertion points are pre-calculated by the DRAM vendor. When the refresh counter N equals the insertion point (N=POS[I]), at block 776, a refresh operation is inserted at position I. In addition, the position counter value I is incremented at block 776, after which the process return to block 774. Otherwise, a refresh operation is performed for the refresh counter value N at block 778 and the refresh counter value N is incremented. At block 780, blocks 774 to 778 are repeated until the refresh counter value N equals 8192 (8K) of the 8K refresh cycle. In this case (block 780: Yes), the process returns to block 772.

Figure 8A:
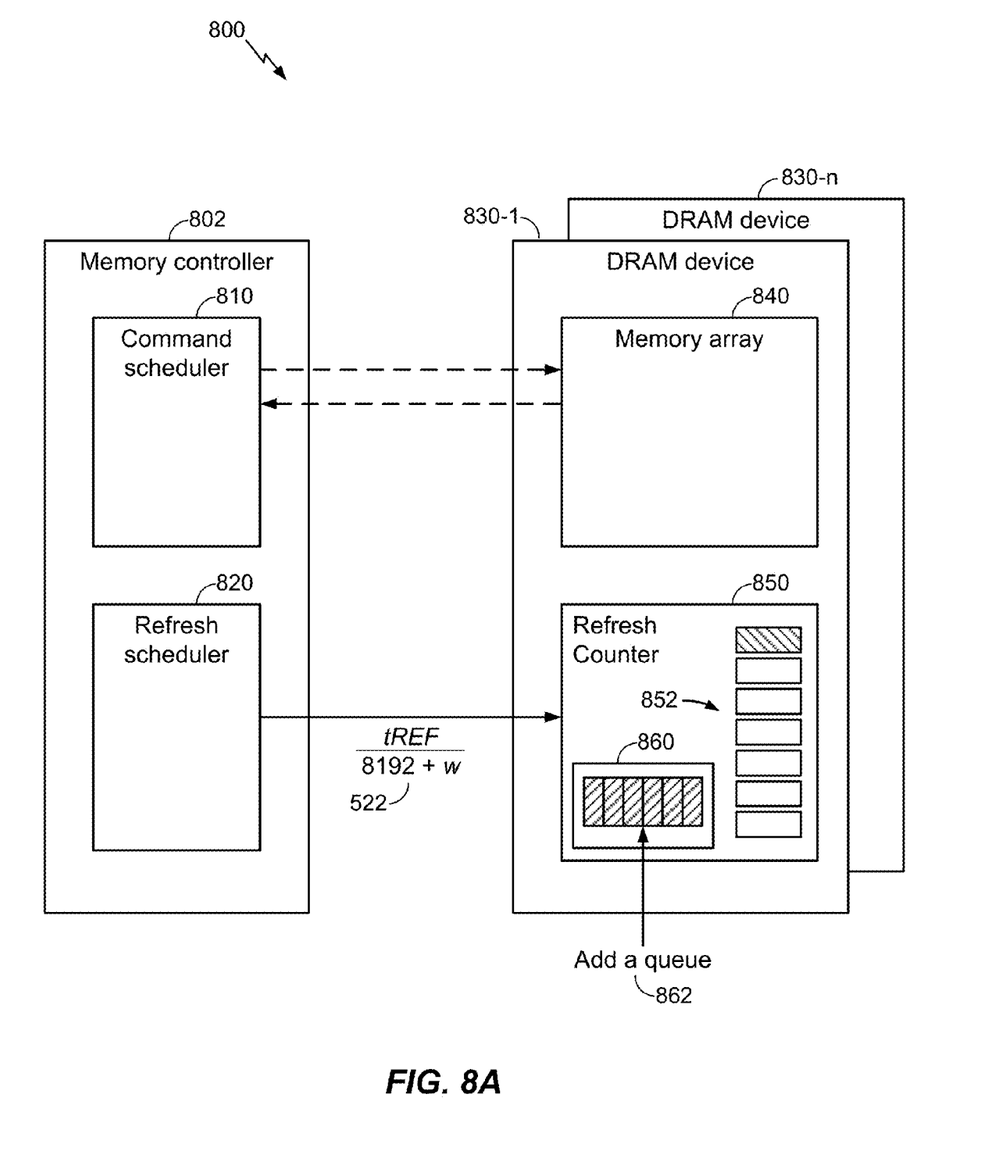
FIG. 8A is a block diagram illustrating a memory controller including a command scheduler and a refresh scheduler to periodically issue refresh commands, and an enhanced refresh counter to insert refresh operations at insertion positions that are computed during runtime according to another aspect of the present disclosure.

FIG. 8A is a block diagram 800 illustrating a memory controller 802 including a command scheduler 810 and a refresh scheduler 820 to insert refresh operations at insertion positions computed during runtime according to a further aspect of the present disclosure. In this configuration, the memory controller 802 is also coupled to DRAM devices 830 (830-1, . . . , 830-N), each including a memory array 840. Although similar to FIG. 7A, in this configuration, the DRAM vendor does not pre-calculate the insertion points (POS[0, 1, . . . , W−1]); only the weak pages (WEAK[0, 1, . . . , W−1]), which are stored in the weak page memory 852, are provided. In this configuration, the refresh counter 850 in combination with the refresh control logic 860 and a queue 862 uniformly compute positions for inserting refresh operations during runtime, as further illustrated in FIG. 8B.

Figure 8B:
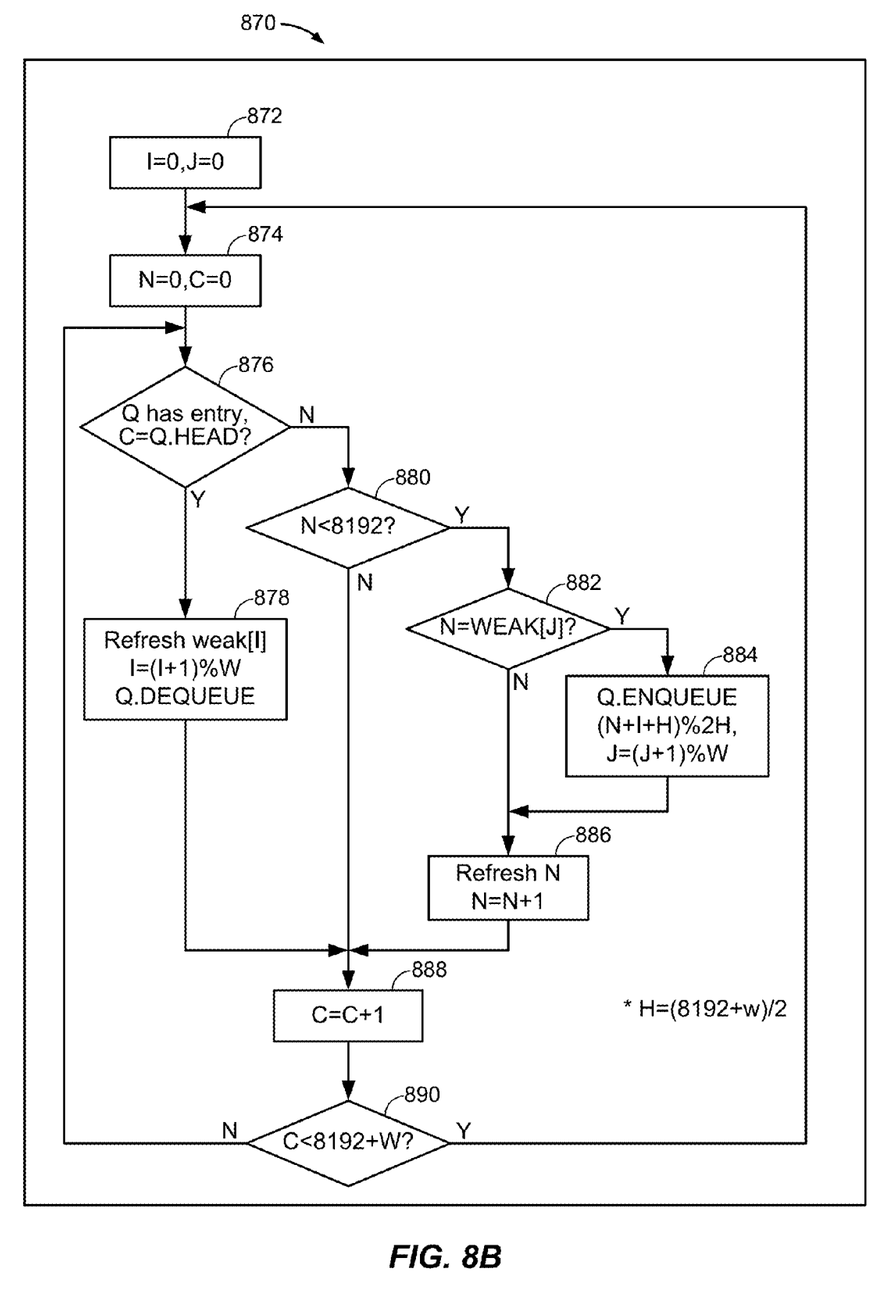
FIG. 8B is a flow chart illustrating a refresh scheme that inserts refresh operations for weak memory rows based on the runtime computed insertion positions of FIG. 8B according to another aspect of the present disclosure.

FIG. 8B is a flow chart 870 illustrating a refresh scheme that inserts refresh operations for weak memory pages at runtime computed insertion positions, according to a further aspect of the present disclosure. At block 872, a position counter value (I) and a producer counter value (J) are initialized. At block 874, a refresh counter value (N) and a refresh cycle counter value (C) are initialized. At block 876, it is determined whether a queue (Q) has an entry. In this configuration, the queue Q is a linked list of refresh cycle counter values that are inserted (enqueued) at the tail of the queue Q and removed (dequeued) from the head of the queue Q. When the queue Q has an entry, the refresh cycle counter value C is set to the current (head) entry in the queue Q (C=Q.HEAD) and block 878 is performed. At block 878, an operation is inserted for a weak page and the position counter value I increments modulo W. When the queue Q is empty, the process of block 880 is performed. At block 878, a refresh operation is inserted at position I. In addition, the position counter value I is incremented modulo W, where W is the number of weak pages. In addition, the current entry of the queue is removed (Q.DEQUEUE).

As further shown in FIG. 8B, when the queue Q is empty, normal refresh operations occur. That is, at block 880 it is determined whether the refresh counter value N is less than 8192 (N<8192) of the 8K refresh cycle. When the refresh counter value N is less than 8K, at block 882, it is determined whether a normal refresh is related to a weak page by comparing the refresh counter value N to a weak page address (N=WEAK[J]) according the producer counter value J. When the refresh counter N equals the weak page address (N=WEAK[J]), at block 886, an extra refresh occurs. That is, a refresh cycle value ((N+I+H) % 2H) is added to the queue Q, where H=(8192+W)/2. In addition, the producer counter value J is incremented modulo W, where W is the number of weak pages. A refresh operation is then performed for the refresh counter value N (e.g., for the weak page), and the refresh counter value N is also incremented at block 886.

If the normal refresh operation is not related to a weak page (block 882: NO), then at block 886 a normal refresh operation is performed and the refresh counter value N increments. At block 888, the refresh cycle counter value C is incremented. At block 890, it is determined whether the refresh cycle counter value C is less than a predetermined value (C<8192+W). If so, control returns to block 874 in which the refresh counter value and the refresh cycle counter value are initialized. Otherwise, control returns to block 876.

Operation of the refresh scheme of FIG. 8B is now described assuming eight memory pages with weak page zero (0), weak page three (3), weak page five (5) and weak page six (6), where S indicates a skipped refresh operation. As shown in Table 1 below, the runtime computation of the insertion positions are stabilized by round four of the refresh scheme, with the weak pages 0, 3, 5 and 6 reflected by the shaded-in blocks:

TABLE 1

Weak Pages Indicated by Shaded Blocks

| Refresh Round 1: Evolving | 0 | 1 | 2 | 3 | 4 | 5 | 0 | 6 | 7 | 3 | S | 5 |
| Refresh Round 2: Evolving | 0 | 6 | 1 | 2 | 3 | 4 | 0 | 5 | 6 | 7 | 3 | S |
| Refresh Round 3: Evolving | 0 | 5 | 6 | 1 | 2 | 3 | 0 | 4 | 5 | 6 | 7 | 3 |
| Refresh Round 4: Stable   | 0 | 1 | 5 | 6 | 2 | 3 | 0 | 4 | 5 | 6 | 7 | 3 |
| Refresh Round 5+: Stable  | 0 | 1 | 5 | 6 | 2 | 3 | 0 | 4 | 5 | 6 | 7 | 3 |

Figure 9:
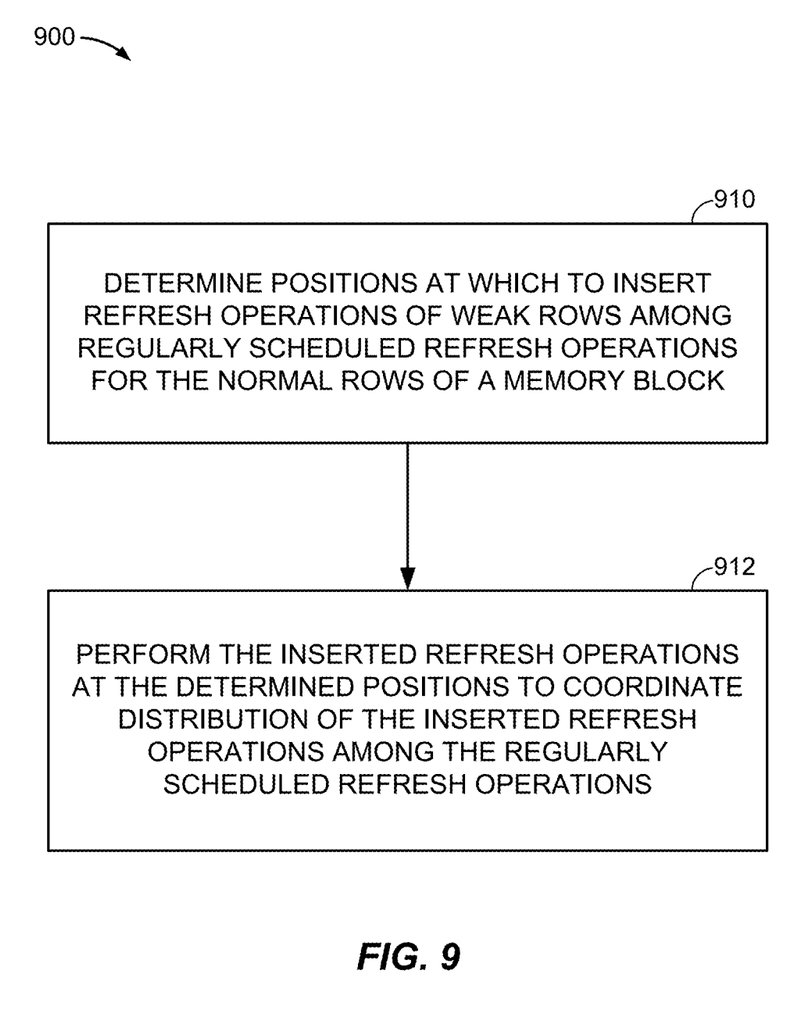
FIG. 9 is a flow chart illustrating a method for refreshing memory rows with a weak retention time according to an aspect of the present disclosure.

FIG. 9 is a flow chart illustrating a method 900 for refreshing memory rows with a weak retention time according to an aspect of the present disclosure. At block 910, positions at which to insert refresh operations for weak rows of a memory block among regularly scheduled refresh operations for the normal rows of the memory block are determined. For example, as shown in FIG. 8A, the refresh counter 850 in combination with the refresh control logic 860 and a queue 862 compute positions for inserting refresh operations during runtime, as further illustrated in FIG. 8B. Alternatively, a DRAM vendor pre-calculates the insertion positions (POS[0, 1, . . . , W−1]), as shown in FIGS. 7A and 7B. In one configuration, the positions at which to insert refresh operations is based, at least in part, on an actual weak page address. At block 912, the inserted refresh operations are performed at the determined positions to coordinate distribution of the inserted refresh operations among the regularly scheduled refresh operations.

In one configuration, a dynamic memory chip includes a memory array coupled to a refresh control block. The refresh control block includes a refresh counter. The refresh control block includes means for determining positions at which to insert refresh operations of weak rows of the memory array among regularly scheduled refresh operations of normal rows of the memory array. In one configuration, the positions at which to insert refresh operations are based on an actual weak page address. In one aspect of the disclosure, the determining means may be the refresh scheduler 720/820 or the refresh control logic 760/860 configured to perform the functions recited by the determining means. In another aspect, the aforementioned means may be any module or any apparatus configured to perform the functions recited by the aforementioned means.

In this configuration, the refresh control block also includes means for performing inserted refresh operations at the determined positions. In this configuration, the inserted refresh operations are performed at the determined positions to evenly distribute the inserted refresh operations among the regularly scheduled refresh operations. In one aspect of the disclosure, the performing means may be the refresh counter 750/760 or the refresh control logic 760/860 configured to perform the functions recited by the performing means. In another aspect, the aforementioned means may be any module or any apparatus configured to perform the functions recited by the aforementioned means.

Figure 10:
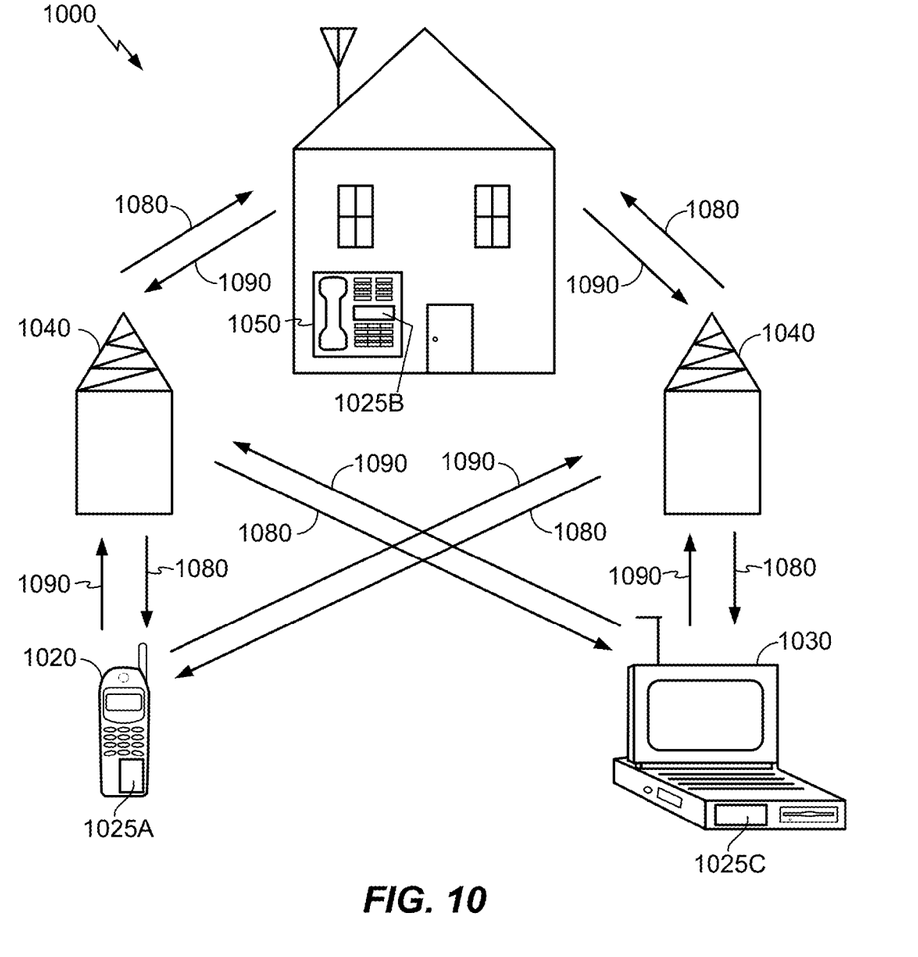
FIG. 10 is a block diagram showing an exemplary wireless communication system in which aspects of the disclosure may be advantageously employed.

FIG. 10 shows an exemplary wireless communication system 1000 in which an aspect of the disclosure may be advantageously employed. For purposes of illustration, FIG. 10 shows three remote units 1020, 1030, and 1050 and two base stations 1040. It will be recognized that typical wireless communication systems may have many more remote units and base stations. Remote units 1020, 1030, and 1050 include memory circuitry 1025A, 1025B, and 1025C, respectively, which are aspects of the disclosure as discussed further below. FIG. 10 shows forward link signals 1080 from the base stations 1040 and the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 10 illustrates memory circuitry according to the teachings of the disclosure, the disclosure is not limited to these exemplary illustrated units. For instance, memory circuitry according to aspects of the present disclosure may be suitably employed in any device.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A memory refresh method, comprising:
    determining positions at which to insert refresh operations of weak rows of a memory block among refresh operations of normal rows of the memory block, wherein the positions at which to insert being based at least in part on weak page;
    determining a refresh command issue interval; and
    performing inserted refresh operations and refresh operations of normal rows on the refresh command issue interval, the inserted refresh operations performed at the determined positions.

2. The memory refresh method of claim 1, in which determining the positions comprises reading the positions from another memory.

3. The memory refresh method of claim 1, in which determining the positions comprises dynamically calculating the positions to selectively distribute the inserted refresh operations among the refresh operations of normal rows.

4. The memory refresh method of claim 1, in which the determined refresh command issue interval is based at least on refresh rate of the normal rows and sum of number of rows and number of weak rows.

5. The memory refresh method of claim 1, further comprising increasing a rate of performing refresh operations according to a predetermined asymmetric ratio of rows having blocks with a weak retention state to rows having a normal retention state.

6. The memory refresh method of claim 1, in which the memory refresh method is performed during an auto refresh cycle.

7. The memory refresh method of claim 1, in which determining the positions comprises computing the positions to selectively distribute the inserted refresh operations among the refresh operations of normal rows.

8. The memory refresh method of claim 1, further comprising reading a retention state of the rows within the memory from another memory.

9. The memory refresh method of claim 1, in which the regularly scheduled refresh operations and the inserted refresh operations execute in a mobile phone, a set top box, a music player, a video player, an entertainment unit, a navigation device, a computer, a hand-held personal communication systems (PCS) unit, a portable data unit, a fixed location data unit, or combination thereof.

10. A dynamic memory chip, comprising:
   a memory array; and
   a refresh control block coupled to the memory array, the refresh control block including a refresh counter and control logic, the control logic operable:
   to determine positions at which to insert refresh operations of weak rows of the memory array among refresh operations of normal rows of the memory array, and the positions at which to insert being based at least in part on weak page,
   to determine a refresh command issue interval, and
   to perform the inserted refresh operations and refresh operations of normal rows on the refresh command issue interval, the inserted refresh operations performed at the determined positions.

11. The dynamic memory chip of claim 10, in which the determined refresh command issue interval is based at east on refresh rate of the normal row and sum of number of rows and number of weak rows.

12. The dynamic memory chip of claim 10, in which the positions are read from a memory.

13. The dynamic memory chip of claim 12, in which the memory includes a retention state of each row within the memory array.

14. The dynamic memory chip of claim 10, in which the control logic is further operable to increase a rate of performing refresh operations according to a predetermined asymmetric ratio of rows having blocks with a weak retention state to rows having a normal retention state.

15. The dynamic memory chip of claim 10, integrated in a mobile phone, a set top box, a music player, a video player, an entertainment unit, a navigation device, a computer, a hand-held personal communication systems (PCS) unit, a portable data unit, a fixed location data unit, or combination thereof.

16. A dynamic memory chip, comprising:
   means for determining positions at which to insert refresh operations of weak rows of the memory array among refresh operations of normal rows of the memory array, wherein the positions at which to insert being based at least in part on weak page,
   means for determining a refresh command issue interval; and
   means for performing inserted refresh operations and refresh operations of normal rows on the refresh command issue interval, the inserted refresh operations performed at the determined positions.

17. The dynamic memory chip of claim 16, in which the determined refresh command issue interval is based at least on refresh rate of the normal rows and sum of number of rows and number of weak rows.

18. A memory refresh method, comprising:
   the step of determining positions at which to insert refresh operations of weak rows of a memory block among refresh operations of normal rows of the memory block, wherein the positions at which to insert being based at least in part on weak page;
   the step of determining a refresh command issue interval; and
   the step of performing inserted refresh operations and refresh operations of normal rows on the refresh command issue interval, the inserted refresh operations performed at the determined positions.

19. The memory refresh method of claim 18, in which the determined refresh command issue interval is based at least on refresh rate of the normal rows and sum of number of rows and number of weak rows.

20. The memory refresh method of claim 18, in which the regularly scheduled refresh operations and the inserted refresh operations execute in a mobile phone, a set top box, a music player, a video player, an entertainment unit, a navigation device, a computer, a hand-held personal communication systems (PCS) unit, a portable data unit, a fixed location data unit, or combination thereof.

* * * * *